(12) United States Patent
Stickelmann

(10) Patent No.: US 12,313,698 B2
(45) Date of Patent: May 27, 2025

(54) METHOD FOR SELF-TESTING OF A PHASE OF A 3-LEVEL ANPC CONVERTER WITH LC FILTER

(71) Applicant: SMA Solar Technology AG, Niestetal (DE)

(72) Inventor: Uwe Stickelmann, Kaufungen (DE)

(73) Assignee: SMA Solar Technology AG, Niestetal (DE)

( * ) Notice: Subject to any disclaimer, the term of this patent is extended or adjusted under 35 U.S.C. 154(b) by 78 days.

(21) Appl. No.: 18/172,358

(22) Filed: Feb. 22, 2023

(65) Prior Publication Data

US 2023/0194626 A1 Jun. 22, 2023

Related U.S. Application Data

(63) Continuation of application No. PCT/EP2021/073996, filed on Aug. 31, 2021.

(30) Foreign Application Priority Data

Sep. 1, 2020 (DE) ..................... 10 2020 122 770.1

(51) Int. Cl.
  *G01R 31/42* (2006.01)
  *H02M 7/537* (2006.01)
(52) U.S. Cl.
  CPC ............ *G01R 31/42* (2013.01); *H02M 7/537* (2013.01)
(58) Field of Classification Search
  CPC ...... G01R 31/42; H02M 7/537; H02M 1/126; H02M 1/36; H02M 7/487; H02M 1/32
  (Continued)

(56) References Cited

U.S. PATENT DOCUMENTS 9,780,669 B2 * 10/2017 Li ..................... H02M 3/33573
2008/0204959 A1    8/2008 Knapp et al.
(Continued)

FOREIGN PATENT DOCUMENTS

CN   106169884 A   11/2016
CN   110187204 A   8/2019
(Continued)

OTHER PUBLICATIONS

International Search Report dated Nov. 25, 2021 in connection with PCT/EP2021/073996.
(Continued)

*Primary Examiner* — Christopher P McAndrew
(74) *Attorney, Agent, or Firm* — Eschweiler & Potashnik, LLC

(57) ABSTRACT

A method for testing an inverter having a bridge comprising a first switch (T1) arranged between a positive connection (DC+) of a divided link circuit, having a center point (M), and a positive inner connection (PI), a second switch (T2) arranged between the positive inner connection (PI) and a bridge output (BR), a third switch (T3) arranged between the bridge output (BR) and a negative inner connection (NI), a fourth switch (T4) arranged between the negative inner connection (NI) and a negative connection (DC−) of the divided link circuit, a fifth switch (T5) arranged between the center point (M) and the positive inner connection (PI), and a sixth switch (T6) arranged between the center point (M) and the negative inner connection (NI) is disclosed. A grid filter having a filter inductor (LF) and a filter capacitor (CF) is connected to the bridge output (BR). The method comprises applying a link circuit voltage to the divided link circuit, while the bridge output (BR) is isolated from a connected grid using the connected grid filter, fully discharging the filter capacitor (CF), closing the first switch (T1) and (Continued)

the sixth switch (T6), while the fourth switch (T4) and the fifth switch (T5) are open, subsequently clocking the second switch (T2) using a plurality of short pulses, wherein the duty cycle of the short pulses is predetermined between 1% and 5%, subsequently to the clocking determining a voltage dropped across the filter capacitor (CF) and identifying a fault state of the bridge when the voltage dropped is outside of a voltage window with an upper window limit and a lower window limit. An inverter is also disclosed, which has a control system designed and set up to execute the method according to one of the preceding claims and to connect the inverter to a connected grid only if a fault state is not identified.

20 Claims, 6 Drawing Sheets

(58) Field of Classification Search
USPC .................................................. 324/764.01
See application file for complete search history.

(56) References Cited

U.S. PATENT DOCUMENTS

| | | |
|---|---|---|
| 2015/0346276 A1 | 12/2015 | Liu et al. |
| 2015/0349521 A1 | 12/2015 | Liu et al. |
| 2017/0047856 A1* | 2/2017 | Lüscher ................ H02M 1/32 |
| 2017/0310239 A1* | 10/2017 | Xu ........................ H02M 7/49 |
| 2021/0384817 A1 | 12/2021 | Stickelmann |

FOREIGN PATENT DOCUMENTS

| | | |
|---|---|---|
| CN | 1110133538 A | 8/2019 |
| DE | 102019104145 A1 | 8/2020 |
| WO | 2018193001 A1 | 10/2018 |

OTHER PUBLICATIONS

Guan Qing-Xin et al. "An Extremely High Efficient Three-Level Active Neutral-Point-Clamped Converter Comprising SiC and Si Hybrid Power Stages"; Oct. 1, 2018; ISSN: 0885-8993, XP011687290.

Kim Ye-Ji et al. "A Switching Method for Improving Lifetime of DC-Link Capacitors in Hybrid ANPC Inverters"; Nov. 1, 2019.

Zhang Bo et al. "An Optimized Open Circuit Switch Faults Diagnosis for Three Level Active NPC Coverter"; Aug. 11, 2019.

* cited by examiner

METHOD FOR SELF-TESTING OF A PHASE OF A 3-LEVEL ANPC CONVERTER WITH LC FILTER

CROSS REFERENCE TO RELATED APPLICATIONS

This application is a continuation of International Patent Application Number PCT/EP2021/073996, filed on Aug. 31, 2021, which claims priority to German Patent Application number 10 2020 122 770.1, filed on Sep. 1, 2020, and is hereby incorporated by reference in its entirety.

FIELD

The disclosure relates to a method for testing an inverter. Furthermore, the application relates to an inverter that is configured to perform the test method.

BACKGROUND

Inverters are used, inter alia, to convert power generated as direct current from a solar generator into alternating current power in order to feed it into an AC grid. For this purpose, an inverter has one or more bridge circuits, which for their part comprise a plurality of semiconductor switches. By clocking the switches, the potentials applied to direct current connections are alternately applied to a bridge output. The bridge output is connected via a mains filter to a phase of the AC voltage grid. There are different topologies for the bridge circuits, wherein a distinction is made between single-level topologies that only alternatively apply the positive potential or the negative potential to the bridge output, and multi-level topologies that apply additional, intermediate potentials usually generated by divided link circuits to the bridge output. One embodiment of such a multi-level topology is referred to as an ANPC (active neutral point clamped) topology and comprises six switches with which the positive potential, the negative potential, and a center point potential of a divided link circuit at the bridge output can be applied depending on the switch configuration. The ANPC topology is a particularly efficient bridge topology.

For reasons of efficiency and cost, semiconductor switches whose highest permissible blocking voltage is less than the input voltage applied to the direct current connections are used in this topology. The topology is therefore operated only with switch configurations where the full input voltage does not drop over any of the switches. A known disadvantage is that, in the event of a failure of one of the switches of the bridge circuit, for example, in the case that one of the bridge switches becomes permanently conductive, actually permissible switch configurations exist, with which nevertheless the full input voltage is applied to a still intact switch due to the failure of the one switch. This results in subsequent damage within the bridge circuit, which can lead to the destruction of additional bridge switches and other components of the inverter.

SUMMARY

The object of this disclosure is therefore to provide a method by which it is possible to check whether there is a failure of a bridge switch before the inverter is started up without additional bridge switches or other inverter components being endangered.

The method according to the disclosure is based on an inverter with which a bridge circuit has a first switch arranged between a positive connection of a divided link circuit having a center point and a positive inner connection, a second switch arranged between the positive inner connection and a bridge circuit output, a third switch arranged between the bridge circuit output and a negative inner connection and a fourth switch arranged between the negative inner connection and a negative connection of the divided link circuit. Furthermore, the bridge circuit has a fifth switch arranged between the center point and the positive inner connection, and a sixth switch arranged between the center point and the negative inner connection, wherein a mains filter having a filter inductor and a filter capacitor is connected to the bridge circuit output. The filter capacitor can be connected by a connection to the center point of the link circuit.

In order to test an inverter with such a bridge circuit, a method according to the disclosure comprises applying a link circuit voltage to the divided link circuit while the bridge circuit output with the connected mains filter is isolated from a connected grid, fully discharging the filter capacitor, closing the first switch and the sixth switch while the fourth switch and the fifth switch are open, subsequently clocking the second switch using a plurality of short pulses, wherein the duty cycle of the short pulses is set between 1% and 5%, after clocking, determining a voltage dropped across the filter capacitor, and identifying a fault state of the bridge when the dropping voltage is outside a voltage window with an upper window limit and a lower window limit. When the bridge circuit switches are completely functional, the filter capacitor is charged by the number of short pulses to a voltage that is a fraction of the link circuit voltage determined by the duty cycle of the short pulses. At the same time, the type of clocking ensures that, even in the event of a defective switch, the full link circuit voltage is not present across any of the other switches at least long enough for it to cause destruction of the relevant switch. This allows the test to be carried out without subsequent damage to the bridge circuit. Even in the event that the sixth switch is permanently blocking due to a defect that, when the second switch is opened, causes the entire link circuit voltage across the second switch to drop, this time is so short due to the low duty cycle that the second switch is nevertheless protected.

If one of the bridge circuit switches is defective so that the filter capacitor is not charged, or is charged in a modified form, because of the defect, this can subsequently be determined on the basis of the voltage achieved at the filter capacitor. In this case, a fault state is detected and the inverter accordingly reacts thereto, for example, by preventing start-up, or selecting a type of activation of the bridge switches that is permissible despite the determined error and does not jeopardize additional components. The inverter usually already has circuitry configured to determine the voltage at the filter capacitor as part of its control.

The method is, in one embodiment, supplemented by fully discharging the filter capacitor, closing the fourth switch and the fifth switch while the first switch and the sixth switch are open, clocking the third switch using a plurality of short pulses, wherein the duty cycle of the short pulses is between 1% and 5%, after clocking, determining an additional voltage dropped across the filter capacitor, and identifying a fault state of the bridge circuit when the dropped additional voltage is outside the voltage window.

These supplementary acts correspond to a repetition of the previously described method acts by clocked application of the negative instead of the positive link circuit voltage. These acts detect additional potential switch defects.

In an alternative embodiment, the second switch is clocked with complementary clocking of the third switch, or the third switch is clocked with complementary clocking of the second switch. Alternatively, the third switch can remain open while clocking the second switch, or the second switch can remain open while clocking the third switch. In this case, the second or third switch can always be clocked with a set number of short pulses.

In one embodiment of the test method according to the disclosure, before clocking the second switch, there is a check of whether potentials at the negative inner connection and the center point correspond, or, before clocking the third switch, there is a check of whether potentials at the positive inner connection and the center point correspond, wherein a fault state of the bridge is always identified when there is no correspondence.

If the inverter has a plurality of bridge circuits, the method according to the disclosure is carried out successively at each of the bridge circuits in order to exclude a fault state. When all bridges with their switches function without errors, the proper operation of the inverter released.

The discharging of the filter capacitor, which is connected by a connection to the center point of the link circuit, can be triggered by concurrently closing the fifth and second switches, or by closing the sixth and third switches. Alternatively, the discharging of the filter capacitor, which is connected by a connection to the center point of the link circuit, can also take place by concurrently closing the fifth and sixth switches.

In another aspect, the disclosure relates to an inverter having a bridge circuit that comprises a first switch arranged between a positive connection of a divided link circuit having a center point and a positive inner connection, a second switch arranged between the positive inner connection and a bridge circuit output, a third switch arranged between the bridge circuit output and a negative inner connection, a fourth switch arranged between the negative inner connection and a negative connection of the divided link circuit, a fifth switch arranged between the center point and the positive inner connection, and a sixth switch arranged between the center point and the negative inner connection, wherein a mains filter having a filter inductor and a filter capacitor is connected to the bridge circuit output. The inverter has a controller that is configured to perform the method described above, and to connect the inverter to a connected grid when a fault state is not detected.

The inverter can have a plurality of bridge circuits. In this case, the controller is configured to perform the method successively for each of the plurality of bridge circuits, and to connect the inverter to the grid when a fault state is not detected.

BRIEF DESCRIPTION OF THE FIGURES

The disclosure is illustrated below with the aid of figures. In the drawings.

DETAILED DESCRIPTION

Figure 1:
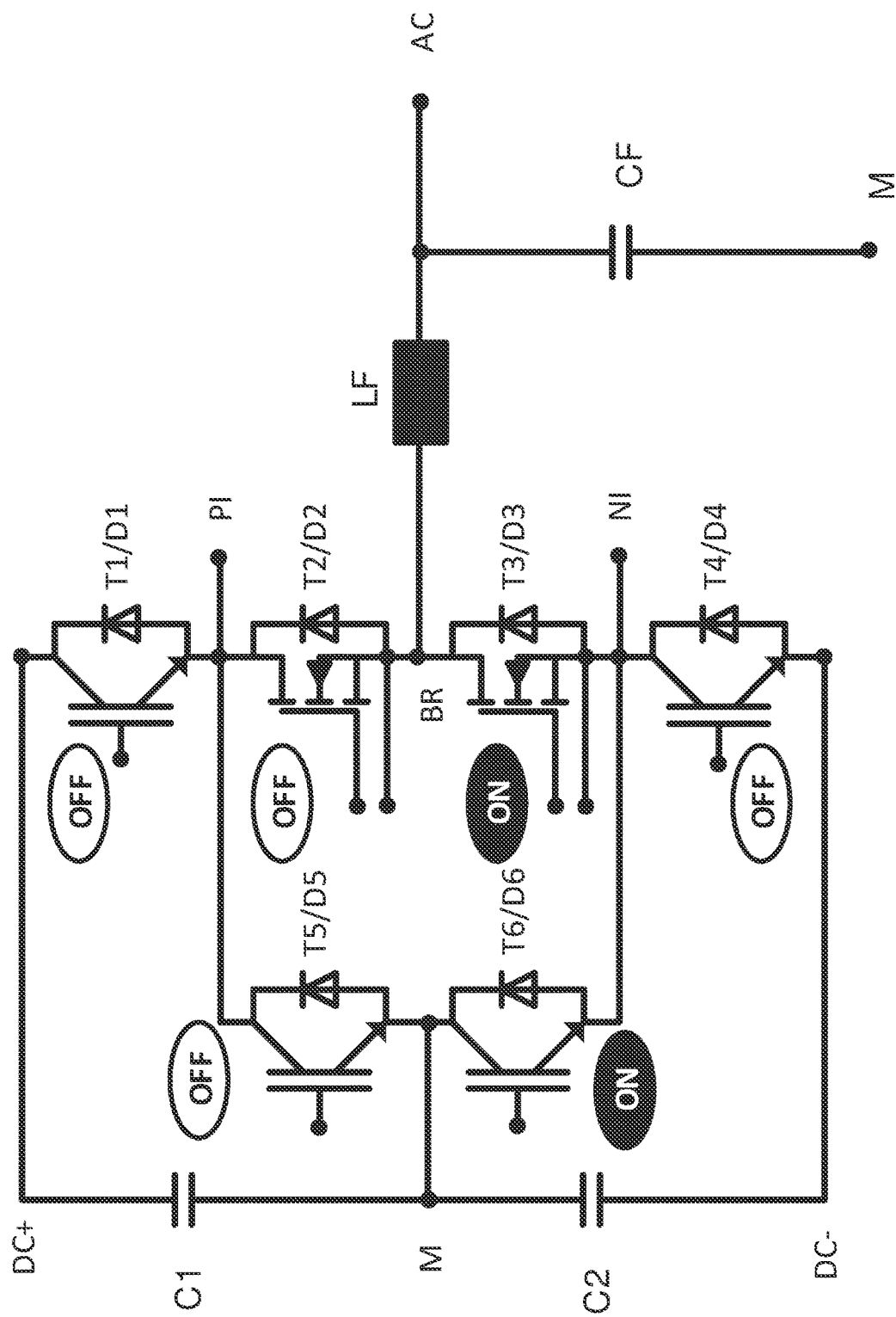
FIG. 1 shows a first switch configuration of a bridge for discharging the filter capacitor.

FIG. 1 shows a switch configuration of an ANPC bridge circuit as used for discharging a filter capacitor CF at the output of the bridge. The ANPC bridge circuit is connected on the input side to a divided link circuit, which has a first link circuit capacitor C1 connected to the positive connection DC+, and a second link circuit capacitor C2 connected to the negative connection DC−, which are interconnected in series via a center point M. A series circuit of a first switch T1 with an anti-parallel freewheeling diode D1, a second switch T2 with an anti-parallel freewheeling diode D2, a third switch T3 with an anti-parallel freewheeling diode D3 and a fourth switch T4 with an anti-parallel freewheeling diode D4 is arranged between the positive connection DC+ and the negative connection DC−. In one embodiment, the first switch T1 and the fourth switch T4 are designed/configured as IGBT transistors, while the second switch T2 and the third switch T3 are designed/configured as MOSFET transistors. The center point M is connected via a fifth switch T5 to a positive inner connection PI between the first switch T1 and the second switch T2. Furthermore, the center point M is connected via a sixth switch T6 to a negative inner connection NI between the third switch T3 and the fourth switch T4. The fifth switch T5 and the sixth switch T6 are likewise designed/configured as IGBT transistors. An output filter with a filter inductor LF and a filter capacitor CF is connected to the bridge output BR arranged between the second switch T2 and the third switch T3 for providing a filtered output voltage at the alternating current voltage output AC.

For discharging the filter capacitor CF, the third transistor T3 and the sixth transistor T6 are switched in a conductive manner (turned on), while all other transistors of the bridge are connected in a blocking manner (turned off). As a result, the filter capacitor CF is short-circuited via the filter inductor LF. As an alternative to the third switch T3 and sixth switch T6, the filter capacitor CF can also be discharged via the second switch T2 and the fifth switch T5, or via the fifth switch T5 and the sixth switch T6. Complete discharging, i.e. to a voltage of zero, also comprises a discharge up to a negligible residual voltage that may be present.

Figure 2:
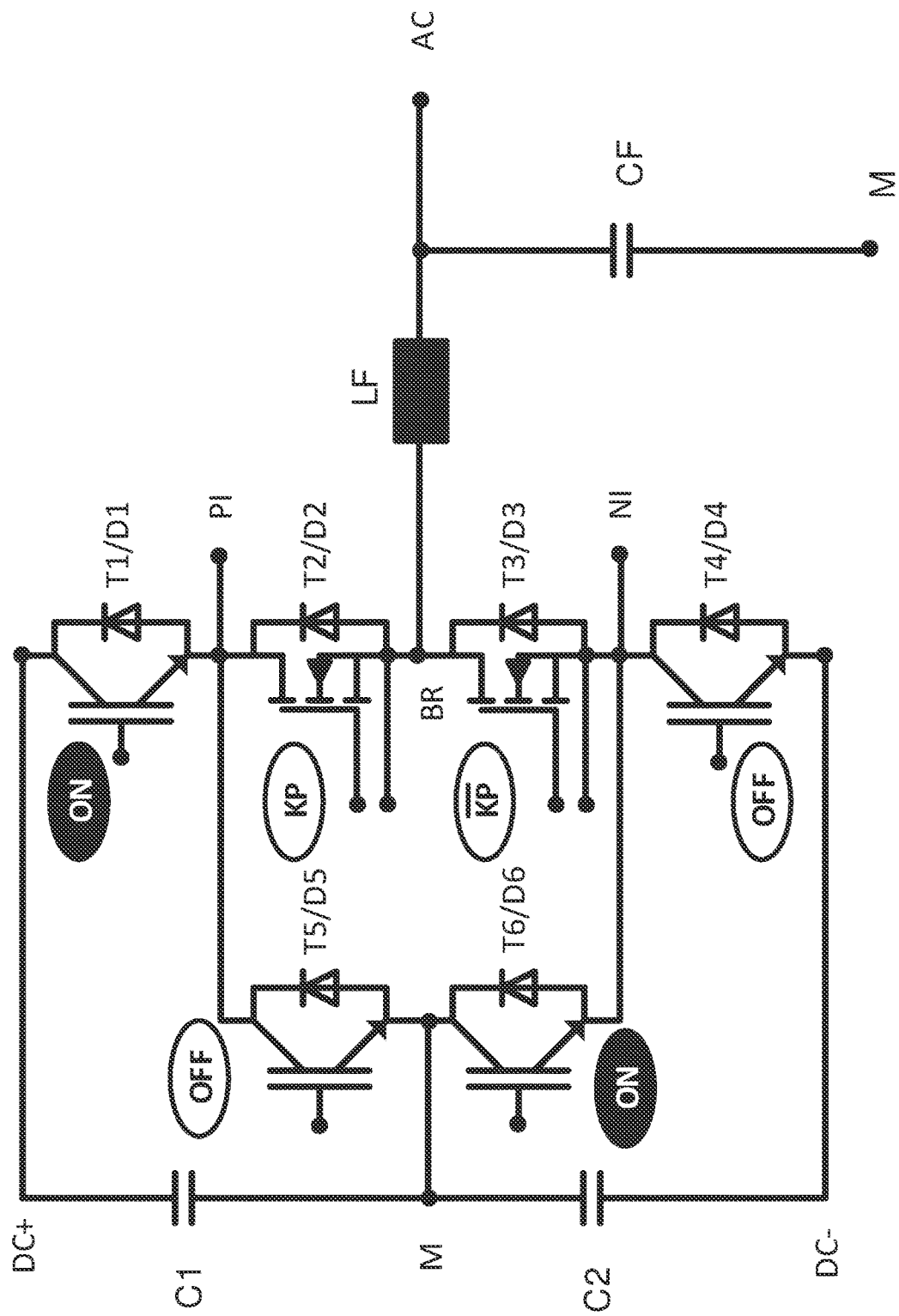
FIG. 2 shows a second switch configuration of the bridge for the complementarily clocked charging of the filter capacitor.

FIG. 2 shows a second switch configuration of the bridge circuit for the complementarily clocked charging of the filter capacitor CF to a test voltage. In this case, the first switch T1 and the sixth switch T6 are switched to conduct, while the fifth switch T5 and the fourth switch T4 are switched to block. The second switch T2 is then clocked at a high frequency with short pulses, whose duty cycle is between 1% and 5%. The third switch T3 is clocked complementarily to the second switch T2. In this way, during the conductive phase of the second switch T2, the filter capacitor CF is charged via the first link circuit capacitor C1 and the filter inductor LF, and is partially discharged again during the conductive phase of the third switch T3. As a result of this clocking, a DC voltage is applied averaged over time to the filter capacitor CF, which DC voltage corresponds to the product of the voltage at the first DC link capacitor C1 and the duty cycle. After the clocking of the second switch T2 and the third switch T3 ends, there is a check of whether the voltage of the filter capacitor CF lies in a voltage window determined by the above-mentioned relationship. If this is not the case, it is concluded that one of the switches of the bridge circuit is defective, and a fault state of the bridge is identified.

Figure 3:
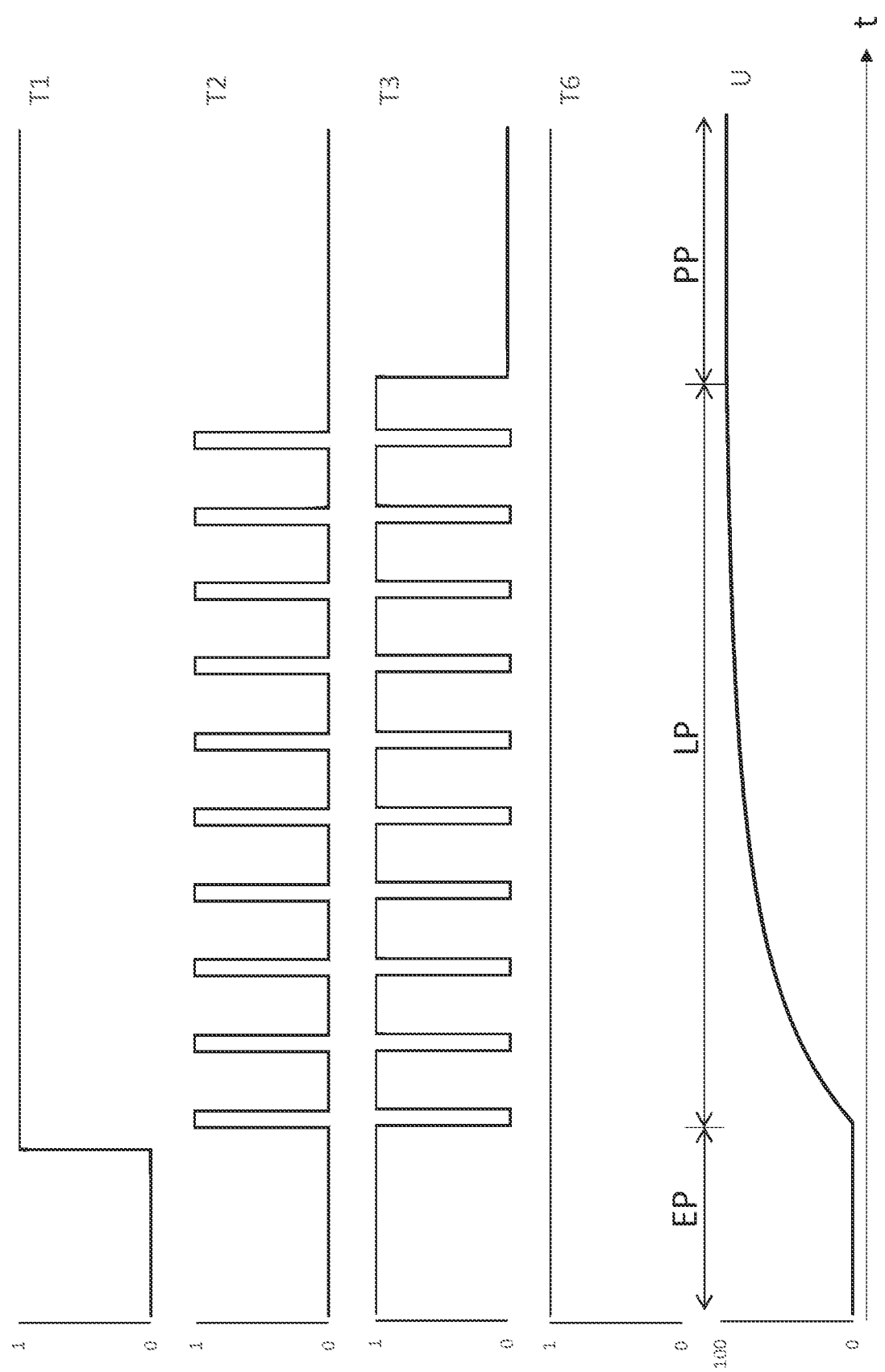
FIG. 3 shows a representation of a timing scheme for the complementarily clocked charging of the filter capacitor.

The timing scheme of the described complementary clocking of the bridge is illustrated in more detail in FIG. 3. In the uppermost part of the diagram, the switching state of the first switch T1, including the switching state of the second switch T2, including the switching state of the third switch T3, and including the switching state of the sixth switch T6 are shown as a function of the time t as the x-axis. The numerical value of the y-axis is 0 for a blocking switch state and 1 for a conductive switch state.

In the lowermost part of the diagram of FIG. 3, the time characteristic of the voltage U at the filter capacitor CF is plotted. After completion of the discharge phase EP, in which the voltage at the filter capacitor CF is zero, the charging phase LP follows with the clocking of the second switch T2 with short pulses and complementary clocking of the third switch T3. In this phase, the voltage U approaches an end value asymptotically, which is compared in the subsequent test phase PP with a permissible voltage window having upper and lower window limits in order to verify the error-free function of the switches.

Figure 4:
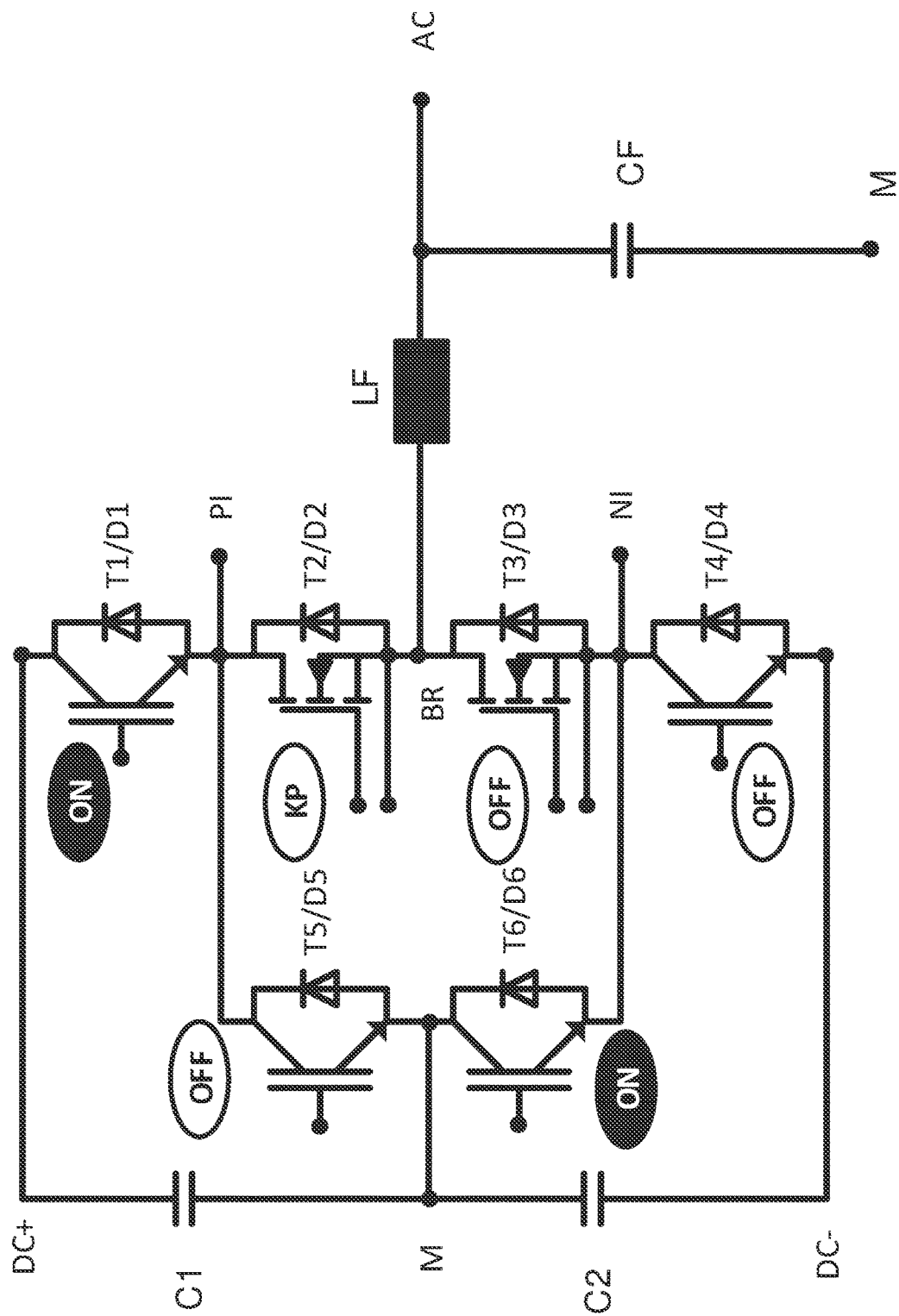
FIG. 4 shows a third switch configuration of the bridge for single clocked charging of the filter capacitor.

The alternative switch configuration shown in FIG. 4 differs from the switch configuration shown in FIG. 2 for charging the filter capacitor CF in that the third switch T3 is not complementary clocked, but is switched to block. This prevents the filter capacitor CF from discharging between the short pulses of the second switch T2, so that the current across the filter inductor LF decreases during this time only via the freewheeling path formed by the third switch T3, the sixth switch T6 and the filter capacitor CF. As a result, the voltage across the filter capacitor builds up stepwise at each short pulse so that, in a test method for the bridge switches in this switch configuration, the charging phase for the filter capacitor CF is ended after a set number of short pulses or after a set charging time before the voltage of the filter capacitor CF is determined to check the bridge switch state.

Figure 5:
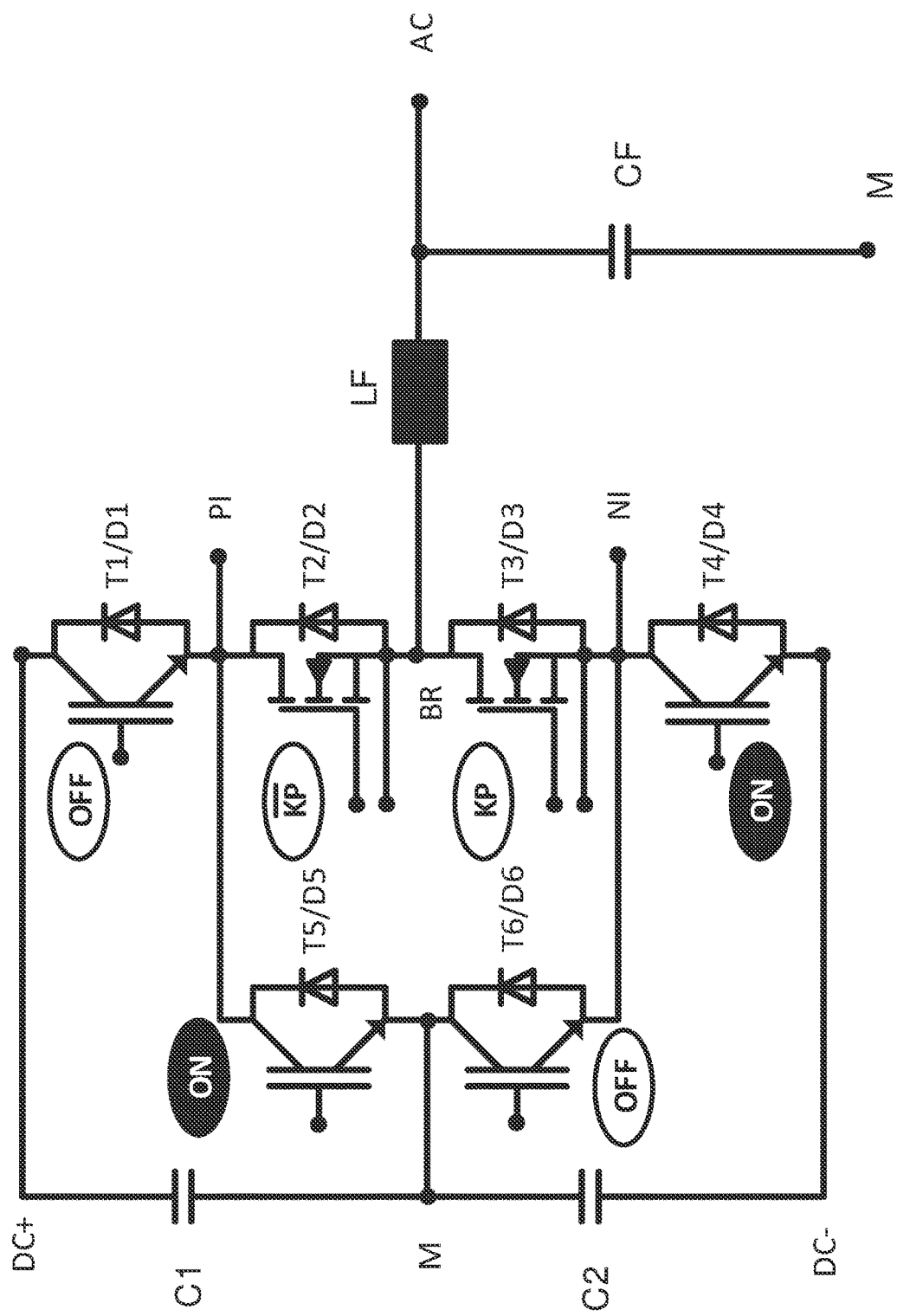
FIG. 5 shows a fourth switch configuration of the bridge for the complementarily clocked charging of the filter capacitor.

The alternative switch configuration shown in FIG. 5 differs from the switch configuration shown in FIG. 2 for charging the filter capacitor CF in that the filter capacitor CF is charged with reverse polarity via the second link circuit capacitor C2. Alternatively, or in addition to the switch configuration shown in FIG. 2, this switch configuration can be used within the framework of the test method, since other switches of the bridge can be checked with respect to their functionality. In this case, the fourth switch T4 and the fifth switch T5 are switched to conduct, while the sixth switch T6 and the first switch T1 are switched to block. The third switch T3 is then clocked at high frequency with short pulses, whose duty cycle is between 1% and 5%. The second switch T2 is clocked complementarily to the third switch T3. Of course, it is also conceivable to modify the switch configuration as described above, in that the second switch T2 is not clocked complementarily, but is switched to block.

Figure 6:
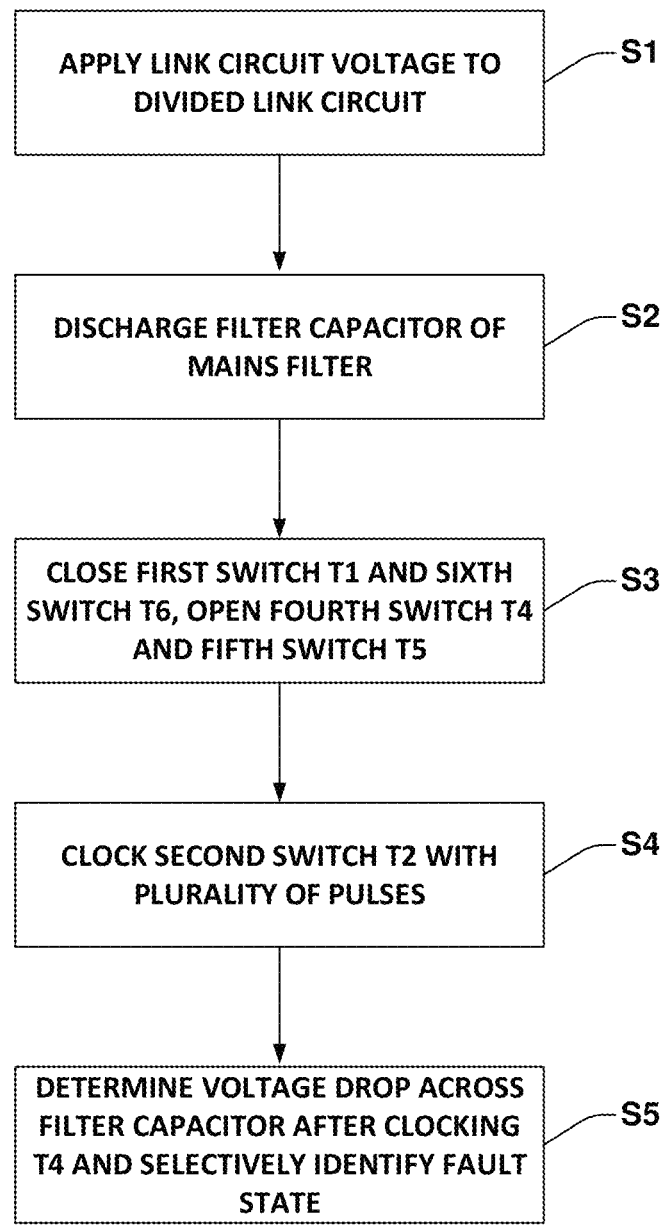
FIG. 6 shows a flowchart of the method according to the disclosure.

Finally, FIG. 6 shows a flow chart for a method according to the disclosure for testing an inverter having a bridge. In a first act S1, a link circuit voltage is applied to the divided link circuit of the inverter, for example, by connecting a DC source to the DC voltage connections DC+, DC− of the inverter. In this case, the bridge circuit output with the connected mains filter is still disconnected from an AC voltage grid. In a second act S2, the filter capacitor of the mains filter is completely discharged. The discharging is caused by the bridge circuit being operated in a switch configuration, in which a conductive path is formed from the center point of the divided link circuit to the bridge circuit output BR. The sequence of performing the first act S1 and the second act S2 is arbitrary.

In a third, subsequent act S3, the first switch T1 and the sixth switch T6 are closed, while the fourth switch T4 and the fifth switch T5 are open. As a result, the positive link circuit potential is applied to the positive inner connection PI of the bridge, and the center point potential is applied to the negative inner connection NI. In a fourth act S4, the second switch T2 is subsequently clocked using a plurality of short pulses, wherein the duty cycle of the short pulses is set between 1% and 5%.

In a final fifth act S5, a voltage dropped across the filter capacitor is then determined after clocking, wherein a fault state of the bridge circuit is identified when the dropping voltage is outside a voltage window with an upper window limit and a lower window limit.

If the inverter has a plurality of bridge circuits, a bridge circuit or a plurality of bridge circuits that are connected via separate or common mains filters to a phase of the AC voltage grid, for example, for each phase of a connected AC voltage grid, the method can be performed in succession for each of the bridge circuits. The method can be supplemented by additional test routines for additional fault patterns of the bridge circuit or other components of the inverter. In order to verify a identified fault state, the method can also be carried out several times.

If a fault state in a bridge circuit is identified by the method, it is possible to react in different ways. For example, a connection of the inverter to the AC voltage grid can be prevented, the inverter can be operated with a deactivated, open bridge, or a control can be selected for the relevant bridge in which it can be operated with limitations. The fault state can furthermore be communicated to a higher-level control entity.

The invention claimed is:
1. A method for testing an inverter having a bridge, comprising:
   a first switch arranged between a positive connection of a divided link circuit having a center point and a positive inner connection,
   a second switch arranged between the positive inner connection and a bridge output,
   a third switch arranged between the bridge output and a negative inner connection,
   a fourth switch arranged between the negative inner connection and a negative connection of the divided link circuit,
   a fifth switch arranged between the center point and the positive inner connection, and
   a sixth switch arranged between the center point and the negative inner connection,
wherein a grid filter with a filter inductor and a filter capacitor is connected to the bridge output,
wherein the method comprises:
   applying a link circuit voltage to the divided link circuit, while the bridge output with a connected mains filter is isolated from a connected grid,
   discharging the filter capacitor,
   closing the first switch and the sixth switch, while the fourth switch and the fifth switch are open,
   subsequently clocking the second switch using a plurality of short pulses, wherein a duty cycle of the pulses is set between 1% and 5%,
   after clocking, determining a voltage dropped across the filter capacitor, and identifying a fault state of the bridge when the dropping voltage is outside a voltage window with an upper window limit and a lower window limit.

2. The method according to claim 1, further comprising:
discharging the filter capacitor,
closing the fourth switch and the fifth switch while the first switch and the sixth switch are open,
clocking the third switch using a plurality of short pulses, wherein a duty cycle of the pulses is between 1% and 5%,
after clocking, determining an additional voltage dropped across the filter capacitor,
identifying a fault state of the bridge when the dropped additional voltage across the filter capacitor is outside the voltage window.

3. The method according to claim 1, wherein while clocking of the second switch, the third switch remains open, and wherein the second switch is clocked with a set number of pulses.

4. The method according to claim 2, wherein while clocking the third switch, the second switch remains open, and wherein the third switch is clocked with a set number of pulses.

5. The method according to claim 1, wherein, before the second switch is clocked, there is a check of whether potentials at the negative inner connection and at the center point correspond, wherein a fault state of the bridge is identified when there is no correspondence.

6. The method according to claim 2, wherein, before the third switch is clocked, there is a check of whether potentials at the positive inner connection and at the center point correspond, wherein a fault state of the bridge is identified when there is no correspondence.

7. The method according to claim 1, wherein the second switch is clocked with complementary clocking of the third switch.

8. The method according to claim 2, wherein the third switch is clocked with complementary clocking of the second switch.

9. The method of claim 1, wherein the inverter comprises a plurality of bridges, and wherein the method is performed sequentially on each of the bridges.

10. The method according to claim 1, wherein the filter capacitor is discharged by simultaneously closing the fifth switch and the second switch, or by closing the sixth switch and third switch or by closing the fifth switch and sixth switch.

11. An inverter having a bridge, comprising:
a first switch arranged between a positive connection of a divided link circuit having a center point and a positive inner connection,
a second switch arranged between the positive inner connection and a bridge output,
a third switch arranged between the bridge output and a negative inner connection,
a fourth switch arranged between the negative inner connection and a negative connection of the divided link circuit,
a fifth switch arranged between the center point and the positive inner connection, and
a sixth switch arranged between the center point and the negative inner connection,
wherein a grid filter with a filter inductor and a filter capacitor (CF) is connected to the bridge output,
wherein the inverter comprises a controller, which is configured to perform a method and to connect the inverter to a connected grid only when a fault state is not detected, the method comprising:
applying a link circuit voltage to the divided link circuit, while the bridge output with the connected mains filter is isolated from a connected grid,
discharging the filter capacitor,
closing the first switch and the sixth switch, while the fourth switch and the fifth switch are open,
subsequently clocking the second switch using a plurality of pulses, wherein the duty cycle of the pulses is set between 1% and 5%,
after clocking, determining a voltage dropped across the filter capacitor, and
identifying a fault state of the bridge when the dropping voltage across the filter capacitor is outside a voltage window with an upper window limit and a lower window limit.

12. The inverter according to claim 11, wherein the inverter has a plurality of bridges, and wherein the controller is configured to perform the method for each of the plurality of bridges sequentially, and to connect the inverter to the grid when a fault state is not detected.

13. The inverter according to claim 11, wherein the controller is further configured to:
discharge the filter capacitor,
close the fourth switch and the fifth switch while the first switch and the sixth switch are open,
clock the third switch using a plurality of pulses, wherein the duty cycle of the pulses is between 1% and 5%,
after clocking, determine an additional voltage dropped across the filter capacitor,
identify a fault state of the bridge when the dropped additional voltage across the filter capacitor is outside the voltage window.

14. The inverter according to claim 11, wherein while clocking of the second switch, the third switch remains open, and wherein the second switch is clocked with a set number of pulses.

15. The inverter according to claim 13, wherein while clocking the third switch, the second switch remains open, and wherein the third switch is clocked with a set number of pulses.

16. The inverter according to claim 11, wherein, before the second switch is clocked, there is a check of whether potentials at the negative inner connection and at the center point correspond, wherein a fault state of the bridge is identified when there is no correspondence.

17. The inverter according to claim 13, wherein, before the third switch is clocked, there is a check of whether potentials at the positive inner connection and at the center point correspond, wherein a fault state of the bridge is identified when there is no correspondence.

18. The inverter according to claim 11, wherein the second switch is clocked with complementary clocking of the third switch.

19. The inverter according to claim 13, wherein the third switch is clocked with complementary clocking of the second switch.

20. The inverter according to claim 11, wherein the filter capacitor is discharged by simultaneously closing the fifth switch and the second switch, or by closing the sixth switch and third switch or by closing the fifth switch and sixth switch.

* * * * *